(12) United States Patent
Ryu et al.

(10) Patent No.: US 10,164,272 B2
(45) Date of Patent: Dec. 25, 2018

(54) PINHOLE DETERMINATION METHOD AND SYSTEM FOR FUEL CELL

(71) Applicant: Hyundai Motor Company, Seoul (KR)

(72) Inventors: Jung Hwan Ryu, Gyeonggi-do (KR); Soon Woo Kwon, Gyeonggi-do (KR)

(73) Assignee: Hyundai Motor Company, Seoul (KR)

( * ) Notice: Subject to any disclaimer, the term of this patent is extended or adjusted under 35 U.S.C. 154(b) by 59 days.

(21) Appl. No.: 15/230,948

(22) Filed: Aug. 8, 2016

(65) Prior Publication Data

US 2017/0317366 A1    Nov. 2, 2017

(30) Foreign Application Priority Data

Apr. 27, 2016  (KR) .................. 10-2016-0051772

(51) Int. Cl.
| | |
|---|---|
| *G01R 31/36* | (2006.01) |
| *H01M 8/04664* | (2016.01) |
| *H01M 8/0438* | (2016.01) |
| *H01M 8/04537* | (2016.01) |
| *H01M 8/04992* | (2016.01) |

(52) U.S. Cl.
CPC .... *H01M 8/04671* (2013.01); *G01R 31/3627* (2013.01); *G01R 31/3648* (2013.01); *H01M 8/04395* (2013.01); *H01M 8/04552* (2013.01); *H01M 8/04992* (2013.01); *H01M 2250/20* (2013.01); *Y02T 90/32* (2013.01)

(58) Field of Classification Search
USPC ........................................ 324/433
See application file for complete search history.

(56) References Cited

U.S. PATENT DOCUMENTS

| | | | |
|---|---|---|---|
| 2011/0091776 A1* | 4/2011 | Rubino | H01M 4/136 429/338 |
| 2011/0178742 A1 | 7/2011 | Krause et al. | |
| 2013/0320987 A1* | 12/2013 | Passot | G01R 31/3648 324/425 |
| 2015/0021193 A1* | 1/2015 | Verfu | C25B 1/14 205/337 |

FOREIGN PATENT DOCUMENTS

| | | | |
|---|---|---|---|
| CN | 101566594 B | * | 7/2012 |
| JP | 2007-066565 A | | 3/2007 |
| JP | 2010-073497 A | | 4/2010 |
| JP | 2010-108815 A | | 5/2010 |
| JP | 2012-059611 A | | 3/2012 |
| KR | 10-2011-0036448 A | | 4/2011 |
| KR | 2011-0062130 A | | 6/2011 |
| KR | 10-2014-0080024 A | | 6/2014 |

* cited by examiner

*Primary Examiner* — Vincent Q Nguyen
(74) *Attorney, Agent, or Firm* — Mintz Levin Cohn Ferris Glovsky and Popeo, P.C.; Peter F. Corless

(57) ABSTRACT

A pinhole determination method for a fuel cell includes steps of blocking air supply to a fuel cell stack by a controller; measuring a cell voltage value of each of unit fuel cells of the fuel cell stack; and determining whether or not a pinhole is present by comparing the cell voltage value with an average cell voltage value.

2 Claims, 3 Drawing Sheets

PINHOLE DETERMINATION METHOD AND SYSTEM FOR FUEL CELL

CROSS REFERENCE TO RELATED APPLICATION

The present application claims under 35 U.S.C. § 119(a) the benefit of Korean Patent Application No. 10-2016-0051772, filed Apr. 27, 2016, the entire contents of which are incorporated by reference herein.

BACKGROUND

(a) Field of the Invention

The present invention relates generally to a pinhole determination method and system for a fuel cell, the method and system being capable of enhancing durability of a fuel cell by accurately determining the presence of a pinhole in each of unit fuel cells stacked in a fuel cell stack.

(b) Description of the Related Art

Generally, a fuel cell is an energy conversion device that converts chemical energy of fuel into electrical energy by electrochemically reacting the chemical energy without changing the chemical energy into heat through combustion. A fuel cell can be used to supply power to not only industrial and home applications, and driving vehicles, but also to small electric/electronic products, and portable devices.

In recent years, a polymer electrolyte membrane fuel cell having a high power density has become the most widely studied fuel cell. The polymer electrolyte membrane fuel cell has many advantages over conventional fuel cells, such as relatively low operating temperature, fast starting time, fast power conversion response time, high energy density, etc.

In a typical fuel cell stack, a membrane electrode assembly, which is a main component, is provided in the innermost region of the fuel cell stack. The membrane electrode assembly includes a polymer electrolyte membrane that allows migration of hydrogen ions therethrough, and electrode layers (i.e., an anode and a cathode) disposed at opposite sides of the polymer electrolyte membrane and coated with a catalyst that promotes a reaction between hydrogen and oxygen.

Further, on each of the outer sides of the membrane electrode assembly, namely the outer sides of the cathode and anode, a gas diffusion layer, a gasket, etc. are stacked in order. The outer sides of the gas diffusion layers are provided with respective separators, with flow paths formed in the separators. Here, the flow paths serve as channels for reaction gas and for cooling water.

With such configuration used as a unit cell, a plurality of the unit cells are stacked and then end plates for supporting the stacked unit cells are coupled to the outermost ends of the stacked unit cells, thereby forming a fuel cell stack in which the unit cells are arranged between the end plates and are coupled to the end plates to form a stack.

During a process of manufacturing the fuel cell stack in this way, a pinhole may occur in the membrane electrode assembly, where the pinhole is hard to detect by the naked eye so that it is difficult to diagnose the presence of a pinhole. In addition, a state of the fuel cell stack as changed by the presence of a pinhole is similar to a state of the fuel cell stack as changed by flooding, so it is difficult to distinguish the states.

The foregoing is intended merely to aid in the understanding of the background of the present invention, and is not intended to mean that the present invention falls within the purview of the related art that is already known to those skilled in the art.

SUMMARY

The present invention provides a pinhole determination method and system for a fuel cell, the method and system enhancing precision of control of the fuel cell by separately determining the presence of a pinhole and the occurrence of flooding in the fuel cell by using a cell voltage of the fuel cell.

In order to achieve the above object, according to one aspect of the present invention, there is provided a pinhole determination method for a fuel cell, the method including: blocking air supply to a fuel cell stack by a controller; measuring a cell voltage value of each of unit fuel cells of the fuel cell stack by the controller; and determining whether or not a pinhole is present by comparing the cell voltage value with an average cell voltage value by the controller.

The determining of the presence of a pinhole may include: deriving, by the controller, the average cell voltage value, which is an average of the measured cell voltage values of the unit fuel cells; deriving, by the controller, a cell voltage deviation value, which is a difference between the measured cell voltage value of each of the unit fuel cells and the average cell voltage value; and determining, by the controller, the presence of a pinhole in a unit fuel cell when the cell voltage deviation value of the unit fuel cell is equal to or greater than a preset reference voltage deviation value.

After the deriving of the cell voltage deviation value, the method may include: performing fast Fourier transform (FFT) on the cell voltage deviation values of the fuel cells at an interval of a preset reference time by the controller; and determining, by the controller, whether or not a pinhole is present using the cell voltage deviation values transformed by the FFT.

The determining of the presence of a pinhole may include: deriving, by the controller, the average cell voltage value, which is an average of the measured cell voltage values of the unit fuel cells; deriving, by the controller, a cell voltage deviation value, which is a difference between the measured cell voltage value of each of the unit fuel cells and the average cell voltage value; extracting, by the controller, the cell voltage deviation values of the unit fuel cells in a descending order as much as a preset reference number; and determining, by the controller, the presence of a pinhole in a unit fuel cell when the extracted cell voltage deviation value of the unit fuel cell is equal to or greater than a preset reference voltage deviation value.

According to another aspect, there is provided a pinhole determination method for a fuel cell, the method including: measuring cell voltage values of unit fuel cells by a controller; deriving, by the controller, a cell voltage deviation value, which is a difference between the measured cell voltage value of each of the unit fuel cells and an average cell voltage value that is an average of the measured cell voltage values; deriving a change rate of the cell voltage deviation value per hour by the controller; and determining, by the controller, the presence of a pinhole in a unit fuel cell when the change rate of the cell voltage deviation value of the unit fuel cell per hour is equal to or greater than a preset reference change rate.

After the deriving of the change rate per hour, the method may include: extracting, by the controller, the change rates of the cell voltage deviation values of the unit fuel cells per hour in a descending order as much as a preset reference number; and determining, by the controller, the presence of a pinhole in the unit fuel cell when the extracted change rate of the cell voltage deviation value of the unit fuel cell per hour is equal to or greater than the preset reference change rate.

According to still another aspect, there is provided a pinhole determination system of a fuel cell, the system including: a unit fuel cell; a fuel cell stack formed by stacking a plurality of unit fuel cells; and a controller blocking air supply to the fuel cell stack, measuring a cell voltage value of each of the unit fuel cells, and determining whether or not a pinhole is present by comparing the cell voltage value with an average cell voltage value.

The controller may derive the average cell voltage value, which is an average of the measured cell voltage values, may derive a cell voltage deviation value which, is a difference between the measured cell voltage value of each of the unit fuel cells and the average cell voltage value, and may diagnose the presence of a pinhole in a unit fuel cell when the cell voltage deviation value of the unit fuel cell is equal to or greater than a preset reference voltage deviation value.

The controller may derive the average cell voltage value, which is an average of the measured cell voltage values of the unit fuel cells, may derive a cell voltage deviation value, which is a difference between the measured cell voltage value of each of the unit fuel cells and the average cell voltage value, and may perform fast Fourier transform (FFT) on the cell voltage deviation values of the unit fuel cells at an interval of a preset reference time, and then may diagnose whether or not a pinhole is present using the cell voltage deviation values transformed by the FFT.

According to yet still another aspect, there is provided a pinhole determination system for a fuel cell, the system including: a unit fuel cell; a fuel cell stack formed by stacking a plurality of unit fuel cells; and a controller measuring cell voltage values of the unit fuel cells, deriving a cell voltage deviation value, which is a difference between the measured cell voltage value of each of the unit fuel cells and an average cell voltage value that is an average of the measured cell voltage values, deriving a change rate of the cell voltage deviation value per hour, and determining the presence of pinhole in a unit fuel cell when the change rate of the cell voltage deviation value of the unit fuel cell per hour is equal to or greater than a preset reference change rate.

The above-mentioned pinhole determination method and system of the fuel cell can realize various effects as follows.

First, the method and system can separately diagnose the presence of a pinhole, which is irreversible degradation, and the occurrence of flooding, which is reversible degradation, thereby enhancing durability of the fuel cell.

Second, the method and system can prevent a pinhole from spreading by upward SR control for removing condensed water due to misdetermining the presence of pinhole for flooding.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION OF THE INVENTION

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Throughout the specification, unless explicitly described to the contrary, the word "comprise" and variations such as "comprises" or "comprising" will be understood to imply the inclusion of stated elements but not the exclusion of any other elements. In addition, the terms "unit", "-er", "-or", and "module" described in the specification mean units for processing at least one function and operation, and can be implemented by hardware components or software components and combinations thereof.

Further, the control logic of the present invention may be embodied as non-transitory computer readable media on a computer readable medium containing executable program instructions executed by a processor, controller or the like. Examples of computer readable media include, but are not limited to, ROM, RAM, compact disc (CD)-ROMs, magnetic tapes, floppy disks, flash drives, smart cards and optical data storage devices. The computer readable medium can also be distributed in network coupled computer systems so that the computer readable media is stored and executed in a distributed fashion, e.g., by a telematics server or a Controller Area Network (CAN).

Hereinbelow, exemplary embodiments of the present invention will be described in detail with reference to the accompanying drawings.

Figure 4:
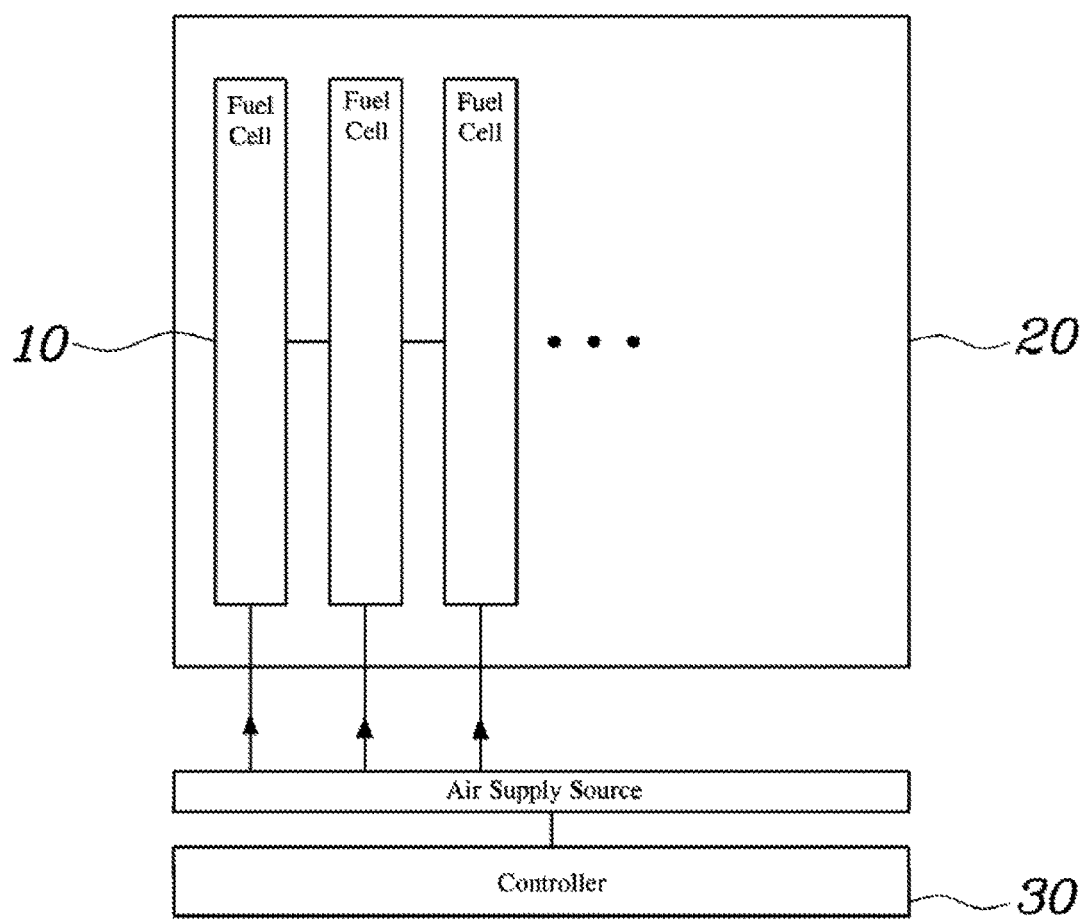
FIG. 4 is a block diagram showing a pinhole determination system of a fuel cell according to an exemplary embodiment of the present invention.

Referring to FIG. 4, a pinhole occurs in a unit fuel cell 10 stacked in a fuel cell stack 20, a cell voltage of the unit fuel cell where the pinhole is present is different from a cell voltage of a unit fuel cell in a normal state. Therefore, typically, when a cell voltage is different from an average cell voltage value, a pinhole is suspected as being present. However, the difference between the cell voltage and the average cell voltage value may occur not only due to the presence of the pinhole, but also due to flooding phenomena. In particular, it is a problem that the difference occurs due to the occurrence of flooding. The pinhole may spread when a controller 30 misdiagnoses the pinhole presence as flooding and increases a stoichiometric ratio (SR) of an air compressor to remove water that is in the fuel cell stack. Accordingly, it is required to distinguish between the presence of a pinhole and the occurrence of flooding for enhanced durability and control of a fuel cell. The present invention relates to a determination method for distinguishing between the presence of a pinhole and the occurrence of flooding. Specifically, according to the present invention, whether or not a pinhole is present in the fuel cell stack 20 is confirmed.

The present invention provides three exemplary embodiments of a pinhole determination method for confirming whether or not a pinhole is present. The first and second exemplary embodiments relate to a pinhole determination method for a fuel cell in an idle stop state, and the third exemplary embodiment relates to a pinhole determination method for a fuel cell in an active state for confirming whether or not a pinhole is present.

Figure 1:
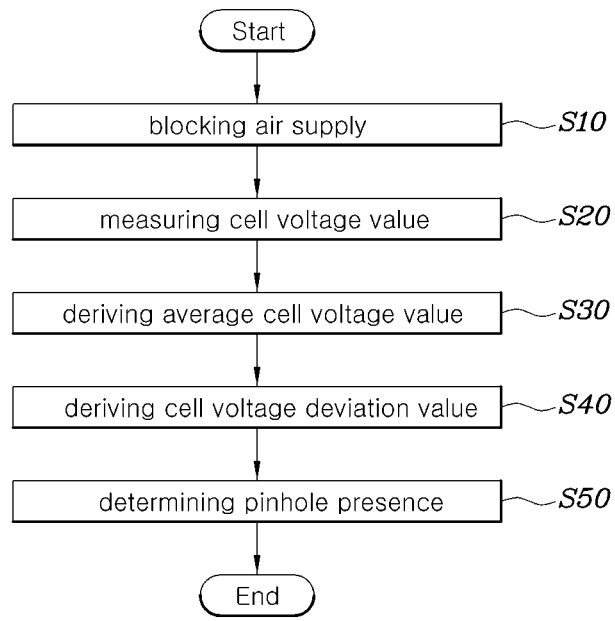
FIG. 1 is a flowchart showing a pinhole determination method of a fuel cell according to a first exemplary embodiment of the present invention.

First, the first exemplary embodiment of the pinhole determination method of the fuel cell in the idle stop state, as shown in FIG. 1, includes blocking air supply to a fuel cell stack 20 by a controller 30 at step S10; measuring cell voltage values of unit fuel cells 10 of the fuel cell stack 20 by the controller 30 at step S20; deriving, by the controller 30, an average cell voltage value, which is an average of the measured cell voltage values of the unit fuel cells 10 at step S30; deriving, by the controller 30, a cell voltage deviation value, which is a difference between the measured cell voltage value of each of the unit fuel cells 10 and the average cell voltage value at step S40; and determining, by the controller 30, the presence of a pinhole in a unit fuel cell 10 when the cell voltage deviation value of the unit fuel cell 10 is equal to or greater than a preset reference voltage deviation value at step S50.

In the case of the fuel cell in the idle stop state, the air supply to the fuel cell stack 20 is blocked so that the fuel cell in the idle stop state is confirmed by the blocking of the air supply at step S10 of FIG. 1. After the blocking of the air supply at step S10, the cell voltage values of the unit fuel cells 10 stacked in the fuel cell stack 20 are measured by the measuring of the cell voltage value at step S20. Regardless of the fuel cell being in the idle stop state, hydrogen of an anode side crosses over to a cathode by the pinhole present in the unit fuel cell 10 and reacts with oxygen remaining in the cathode, and then voltage is generated. Therefore, a cell voltage is measured by the measuring of the cell voltage value at step S20 as a first step for detecting a cell voltage changed by the hydrogen crossover.

After the measuring of the cell voltage value at step S20, the average cell voltage value, which is an average of the measured cell voltage values of the unit fuel cells, wherein the measured cell voltage values are measured by the measuring of the cell voltage value at step S20, is derived by the deriving of the average cell voltage value at step S30. Then, the cell voltage deviation value, which is a difference between the derived average cell voltage value and the measured cell voltage value of each of the unit fuel cells, is derived from each of the unit fuel cells stacked in the fuel cell stack by the deriving of the cell voltage deviation value at step S40, wherein the cell voltage deviation value is a reference for determining the cell voltage change by the hydrogen crossover.

After the deriving of the cell voltage deviation value at step S40, whether or not a pinhole is present in each of the unit fuel cells is determined by determining the presence of a pinhole at step S50. Specifically, the cell voltage deviation value of each of the unit fuel cells derived by the deriving of the cell voltage deviation value at step S40 is compared with the preset reference voltage deviation value. Then, the presence of a pinhole in a unit fuel cell is determined when the cell voltage deviation value of the unit fuel cell is equal to or greater than the reference voltage deviation value.

The reference voltage deviation value is a reference value for determining whether or not a pinhole is present in a unit fuel cell. As described above, the reference voltage deviation value is a value for distinguishing between the presence of a pinhole and the occurrence of flooding. The reference voltage deviation value is different depending on a rated cell voltage of each of the unit fuel cells. If the rated cell voltage is 0.8~1 V, the reference voltage deviation value is about 0.2 V. That is, the presence of the pinhole in the unit fuel cell is determined when the cell voltage deviation exceeds at least 0.2 V.

Whether or not a pinhole is present in each of the unit fuel cells 10 stacked in the fuel cell stack 20 is determined by the pinhole determination method as described above. However, because of a plurality of unit fuel cells 10 being present in the fuel cell stack 20, determining the presence of a pinhole in every unit fuel cell 10 based on the measured cell voltage of every unit fuel cell 10 of the fuel cell stack 20 excessively burdens the controller 30, and response of pinhole determination decreases.

Therefore, as a method for enhancing the response of pinhole determination, the present invention includes, after the deriving of the cell voltage deviation value at step S40, extracting, by the controller 30, the cell voltage deviation values of the unit fuel cells 10 in a descending order as much as a preset reference number; and determining, by the controller 30, the presence of a pinhole in a unit fuel cell 10 when the extracted cell voltage deviation value of the unit fuel cell 10 is equal to or greater than a preset reference voltage deviation value. By using the described method, the number of the unit fuel cells 10 for determining the pinhole determination decreases so that the response of pinhole determination increases. Also, the cell voltage deviation values of the unit fuel cells 10 are extracted in a descending order to diagnose whether or not a pinhole is present, so that by using the pinhole determination method, it is possible to lessen the case of missing the unit fuel cell 10 where the pinhole is present. The preset reference number is a value that is appropriately set by a designer depending on a determined priority between response and accuracy of the pinhole determination method. When the response of the pinhole determination method is a priority, a lower preset reference number is better, and when the accuracy of the pinhole determination method is a priority, a higher preset reference number is better.

Figure 2:
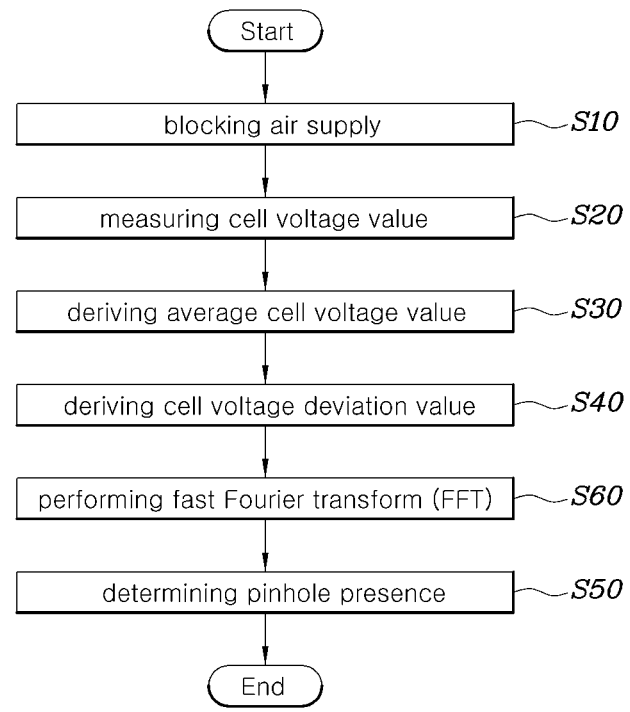
FIG. 2 is a flowchart showing a pinhole determination method of a fuel cell according to a second exemplary embodiment of the present invention.

Second, FIG. 2 shows the second exemplary embodiment of the pinhole determination method of the fuel cell in the idle stop state. The blocking of the air supply at step S10 to the deriving of the cell voltage deviation value at step S40 are performed in the same manner as in FIG. 1. However, after the deriving of the cell voltage deviation value at step S40, as shown in FIG. 2, fast Fourier transform (FFT) on the cell voltage deviation values of the unit fuel cells 10 at an interval of a preset reference time is performed by the controller 30 at step S60.

As described above, the pinhole determination method of FIG. 1 relates to determining whether or not a pinhole present by individually comparing the cell voltage deviation value of each of the unit fuel cells 10 stacked in the fuel cell stack 20 so that response of the pinhole determination decreases because of a long period of the pinhole determination. In this way, rather than individually determining whether or not a pinhole is present in each of the unit fuel cells 10 of the fuel cell stack 20, it is desirable to firstly diagnose the presence of a pinhole in the fuel cell stack 20, and properly control the fuel cell in the case of the presence of a pinhole, and secondly diagnose whether or not a pinhole is present in a unit fuel cell 10.

The performing of the FFT at step S60, shown in FIG. 2, is a step therefor. Whether or not a pinhole is present in the fuel cell stack 20 is determined by simultaneously performing fast Fourier transform on the cell voltage deviation values of the unit fuel cells 10 derived by the deriving of the cell voltage deviation value at step S40. There are various methods for performing fast Fourier transform on the cell voltage deviation values of the unit fuel cells 10. For example, performing fast Fourier transform on inverted values of the differences between the average cell voltage value and the measuring cell voltage values of the unit fuel cells 10 may be considered.

After the performing of the FFT at step S60, as shown in FIG. 2, the determining of the presence of a pinhole at step S50 is performed. Specifically, at step S50, when a pinhole is not present, magnitude values transformed by the fast Fourier transform are substantially close to 0, however, when a pinhole is present, magnitude values transformed by the fast Fourier transform exceed 0, for example, 3. In this case, the presence of a pinhole in the fuel cell stack 20 is determined.

According to the pinhole determination method shown in FIG. 2, it is not possible to specifically diagnose a unit fuel cell 10 of the fuel cell stack 20 where a pinhole occurs. However, determining whether or not a pinhole is present in the fuel cell stack 20 of the pinhole determination method shown in FIG. 2 is faster than that of the pinhole determination method shown in FIG. 1. Therefore, using the pinhole determination method shown in FIG. 2 is desirable when a rapid pinhole determination method of the fuel cell stack 20 is required.

Figure 3:
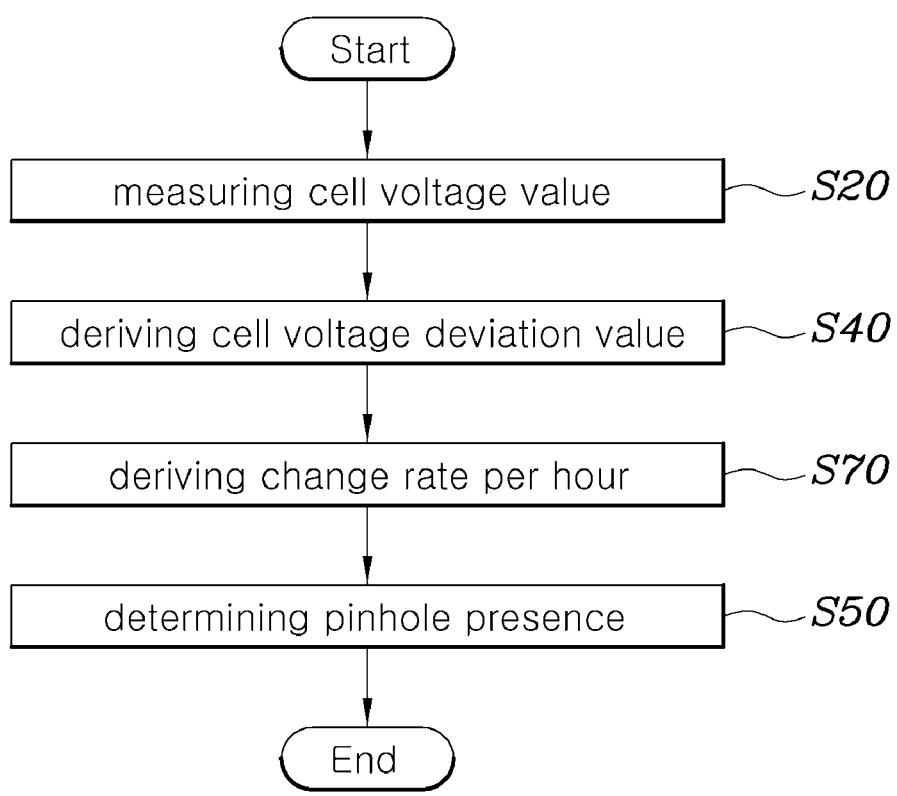
FIG. 3 is a flowchart showing a pinhole determination method of a fuel cell according to a third exemplary embodiment of the present invention.

Finally, the third exemplary embodiment of the pinhole determination method of the fuel cell in the active state, as shown in FIG. 3, includes measuring cell voltage values of unit fuel cells 10 by a controller 30 at step S20; deriving, by the controller 30, a cell voltage deviation value, which is a difference between the measured cell voltage value of each of the unit fuel cells 10 and an average cell voltage value that is an average of the measured cell voltage values at step S40; deriving a change rate of the cell voltage deviation value per hour by the controller 30 at step S70; and determining, by the controller 30, the presence of a pinhole in a unit fuel cell 10 at step S50 when the change rate of the cell voltage deviation value of the unit fuel cell 10 per hour is equal to or greater than a preset reference change rate.

The third exemplary embodiment is not a pinhole determination method of a fuel cell in an idle stop state so that the blocking of the air supply at step S10 is not included in the third exemplary embodiment, which is different from the first and second exemplary embodiments. However, the third exemplary embodiment uses the cell voltage deviation value as the first and second exemplary embodiments do, so that the third exemplary embodiment includes the measuring of the cell voltage value at step S20 and the deriving of the cell voltage deviation value at step S40 as the first and second exemplary embodiments do.

After the deriving of the cell voltage deviation value at step S40, the deriving of the change rate per hour at step S70, as shown in FIG. 3, is performed because when a pinhole is present in the unit fuel cell 10, the cell voltage deviation instantly peaks as time passes. Accordingly, the change rate of the cell voltage deviation value per hour is derived as a first step for determining whether or not a pinhole is present in the fuel cell using the phenomenon of the peak cell voltage deviation. After the deriving of the change rate of the cell voltage deviation value per hour, whether or not a pinhole is present a unit fuel cell 10 is determined by comparing the change rate of the cell voltage deviation value per hour, derived by the determining of the presence of the pinhole at step S50, with the preset reference change rate.

The preset reference change rate is a reference value for determining the instant peak occurrence of the cell voltage deviation caused by the presence of the pinhole in the unit fuel cell and, similarly to the previously described reference voltage deviation value, the reference change rate is can vary, depending on a rated cell voltage of each of the unit fuel cells. If the rated cell voltage is 0.8~1 V, the reference change rate is better to be set to about 0.2 V/s.

When the derived change rate of the cell voltage deviation value per hour is equal to or greater than the reference change rate, the peak occurrence by the presence of a pinhole in the unit fuel cell is determined. Even though the fuel cell is in the active state, the presence of a pinhole in each of the unit fuel cells is determined by using the method described in the third exemplary embodiment. However, as described above, the response of the pinhole determination decreases because of determining whether or not a pinhole is present in each of the unit fuel cells stacked in the fuel cell stack. For enhancing the response of the pinhole determination, the present invention includes the method for determining whether or not a pinhole is present using the change rate per hour including, after the deriving of the change rate per hour at step S70, extracting, by the controller 30, the change rates of the cell voltage deviation values of the unit fuel cells per hour in a descending order in an amount as much as a preset reference number; and determining, by the controller 30, the presence of a pinhole in a unit fuel cell when the extracted change rate of the cell voltage deviation value of the unit fuel cell per hour is equal to or greater than a preset reference change rate.

Therefore, whether or not a pinhole is present in each of the unit fuel cells 10 or in the fuel cell stack 20 is determined by using the three methods (the first is the method of using the cell voltage deviation value, the second is the method of using the FFT, and the third is the method of using the change rate of the cell voltage deviation value per hour). When the presence of a pinhole in a unit fuel cell 10 is determined, the unit fuel cell 10 having the pinhole may be replaced with a new cell. According to the present invention, the durability of the fuel cell is enhanced.

In addition, according to an exemplary embodiment of the present invention, a pinhole determination system of a fuel cell includes a unit fuel cell 10; a fuel cell stack 20 formed by stacking a plurality of unit fuel cells 10; and a controller 30 blocking air supply to the fuel cell stack 20, measuring a cell voltage value of each of the unit fuel cells 10, and determining whether or not a pinhole is present by comparing the cell voltage value with an average cell voltage value.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A pinhole determination method for a fuel cell, the method comprising the steps of:

blocking air supply to a fuel cell stack by a controller;

measuring a cell voltage value of each of unit fuel cells of the fuel cell stack by the controller; and determining whether or not a pinhole is present by comparing the cell voltage value with an average cell voltage value by the controller, wherein the determining step further comprises:

deriving, by the controller, the average cell voltage value, which is an average of the measured cell voltage values of the unit fuel cells;

deriving, by the controller, a cell voltage deviation value, which is a difference between the measured cell voltage value of each of the unit fuel cells and the average cell voltage value; and determining, by the controller, the presence of the pinhole in a unit fuel cell when the cell voltage deviation value of the unit fuel cell is equal to or greater than a preset reference voltage deviation value, wherein after carrying out the step of deriving the cell voltage deviation value, further comprising the steps of:

performing fast Fourier transform (FFT) on the cell voltage deviation values of the unit fuel cells at an interval of a preset reference time by the controller; and determining, by the controller, whether or not the pinhole is present using the cell voltage deviation values transformed by the FFT.

2. The method of claim 1, wherein the step of determining the presence of the pinhole comprises:

extracting, by the controller, the cell voltage deviation values of the unit fuel cells in a descending order as much as a preset reference number; and determining, by the controller, the presence of the pinhole in the unit fuel cell when the extracted cell voltage deviation value of the unit fuel cell is equal to or greater than the preset reference voltage deviation value.

* * * * *